United States Patent
Van De Kerkhof et al.

(10) Patent No.: US 12,249,480 B2
(45) Date of Patent: Mar. 11, 2025

(54) FLUID TRANSFER SYSTEM IN A CHARGED PARTICLE SYSTEM

(71) Applicant: ASML Netherlands B.V., Veldhoven (NL)

(72) Inventors: Marcus Adrianus Van De Kerkhof, Helmond (NL); Jing Zhang, Eindhoven (NL); Martijn Petrus Christianus Van Heumen, Santa Clara, CA (US); Patriek Adrianus Alphonsus Maria Bruurs, Baarle-Nassau (NL); Erheng Wang, San Jose, CA (US); Vineet Sharma, San Jose, CA (US); Makfir Sefa, San Jose, CA (US); Shao-Wei Fu, San Jose, CA (US); Simone Maria Scolari, Eindhoven (NL); Johannes Andreas Henricus Maria Jacobs, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/643,379

(22) Filed: Apr. 23, 2024

(65) Prior Publication Data
US 2024/0274400 A1    Aug. 15, 2024

Related U.S. Application Data

(63) Continuation of application No. 17/179,165, filed on Feb. 18, 2021, now Pat. No. 11,996,262.
(Continued)

(51) Int. Cl.
*H01J 37/20* (2006.01)
*F16L 11/04* (2006.01)
(Continued)

(52) U.S. Cl.
CPC ............ *H01J 37/20* (2013.01); *F16L 11/04* (2013.01); *F16L 11/12* (2013.01);
(Continued)

(58) Field of Classification Search
CPC .. H01J 37/00; H01J 37/02; H01J 37/20; H01J 37/18; H01J 37/26; H01J 37/28;
(Continued)

(56) References Cited

U.S. PATENT DOCUMENTS

| 4,347,204 A | 8/1982 | Takagi et al. |
| 4,478,275 A | 10/1984 | Ernst |

(Continued)

FOREIGN PATENT DOCUMENTS

| JP | H02209224 A | 8/1990 |
| JP | 2001297967 A | 10/2001 |

(Continued)

OTHER PUBLICATIONS

3M Liqui-Cel; A high level of consistency and control; 3MTM Liqui-Cel Membrane Contactors; Precision gas control. Enabling ultra-pure water and extra bubbly beverages. Advanced membrane technology for dissolved gas control; LC-1096, Rev. Mar. 2017 (8 pgs.).

(Continued)

*Primary Examiner* — Jason L McCormack
(74) *Attorney, Agent, or Firm* — Finnegan, Henderson, Farabow, Garrett & Dunner, LLP

(57) ABSTRACT

Apparatuses, systems, and methods for transferring fluid to a stage in a charged particle beam system are disclosed. In some embodiments, a stage may be configured to secure a wafer; a chamber may be configured to house the stage; and a tube may be provided within the chamber to transfer fluid between the stage and outside of the chamber. The tube may include a first tubular layer of first material, wherein the first (Continued)

material is a flexible polymer; and a second tubular layer of second material, wherein the second material is configured to reduce permeation of fluid or gas through the tube. In some embodiments, a system may include a degasser system outside of the chamber, where the degasser system may be configured to remove gases from the transfer fluid before the transfer fluid enters the tube.

15 Claims, 13 Drawing Sheets

Related U.S. Application Data

(60) Provisional application No. 62/989,464, filed on Mar. 13, 2020, provisional application No. 62/978,188, filed on Feb. 18, 2020.

(51) Int. Cl.
  *F16L 11/12* (2006.01)
  *B01D 19/00* (2006.01)
  *H01L 21/67* (2006.01)

(52) U.S. Cl.
  CPC ... *B01D 19/0068* (2013.01); *H01J 2237/2001* (2013.01); *H01L 21/67288* (2013.01)

(58) Field of Classification Search
  CPC .......... H01J 2237/006; H01J 2237/182; F16L 11/04; F16L 11/12; B01D 19/0068; H01L 2237/2001; H01L 21/67288
  USPC ................. 250/306, 307, 311, 440.11, 443.1
  See application file for complete search history.

(56) References Cited

U.S. PATENT DOCUMENTS

| | | | |
|---|---|---|---|
| 5,271,977 A | 12/1993 | Yoshikawa et al. | |
| 2002/0000029 A1* | 1/2002 | Emoto | F16L 9/19 |
| | | | 700/121 |
| 2002/0079464 A1 | 6/2002 | Driessen et al. | |
| 2004/0069330 A1* | 4/2004 | Rolfson | B08B 3/04 |
| | | | 96/155 |
| 2004/0182463 A1 | 9/2004 | Bessette et al. | |
| 2005/0217745 A1 | 10/2005 | Watanabe et al. | |
| 2007/0166497 A1 | 7/2007 | Shimono et al. | |
| 2010/0017346 A1 | 1/2010 | Extrand et al. | |
| 2010/0233400 A1 | 9/2010 | Sano | |
| 2012/0234082 A1* | 9/2012 | Yu | G01N 23/2204 |
| | | | 73/61.41 |
| 2014/0011717 A1 | 1/2014 | Thornton et al. | |
| 2014/0174035 A1 | 6/2014 | Murray | |
| 2015/0059904 A1 | 3/2015 | Nokkentved et al. | |
| 2015/0335823 A1 | 11/2015 | Weikart et al. | |
| 2016/0076675 A1 | 3/2016 | Kan et al. | |
| 2021/0009735 A1 | 1/2021 | Bando et al. | |

FOREIGN PATENT DOCUMENTS

| | | |
|---|---|---|
| JP | 2003247676 A | 9/2003 |
| JP | 2005184017 A | 7/2005 |
| JP | 2005529767 A | 10/2005 |
| JP | 2007237687 A | 9/2007 |
| JP | 2009512227 A | 3/2009 |
| JP | 2009277680 A | 11/2009 |
| JP | 2012211349 A | 11/2012 |
| JP | 2014159032 A | 9/2014 |
| TW | 201023294 A | 6/2010 |
| TW | I366572 B | 6/2012 |
| TW | 201348891 A | 12/2013 |
| WO | 2001023794 A1 | 4/2001 |
| WO | 2005108051 A1 | 11/2005 |
| WO | 2013160021 A1 | 10/2013 |

OTHER PUBLICATIONS

3M Liqui-Cel MM Series Membrane Contactor abstract (2 pgs.).
Casiraghi, Cinzia et al.; Diamond-like carbon for data and beer storage; materialstoday; Jan.-Feb. 2007; vol. 10; No. 1-2 (10 pgs.).
Weston, G F; Materials for ultrahigh vacuum; Vacuum / vol. 25 / No. 11/12 (16 pgs.).
Notice of Reasons for Rejection from the Japan Patent Office issued in related Japanese Patent Application No. 2022-547056; mailed Jul. 28, 2023 (13 pgs.).

* cited by examiner

FLUID TRANSFER SYSTEM IN A CHARGED PARTICLE SYSTEM

CROSS-REFERENCE TO RELATED APPLICATIONS

This application is a continuation application of U.S. application Ser. No. 17/179,165 which was filed Feb. 18, 2021, which claims priority of U.S. application 62/978,188, which was filed on Feb. 18, 2020, and of U.S. application 62/989,464, which was filed on Mar. 13, 2020. All these applications are hereby incorporated by reference in their entireties.

FIELD

The description herein relates to the field of charged particle beam systems, and more particularly to systems for transferring fluids in charged particle beam inspection systems.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments of the present disclosure provide apparatuses, systems, and methods for transferring water to a stage in a charged particle beam system. In some embodiments, a stage may be configured to secure a wafer; a chamber may be configured to house the stage; and a tube may be provided within the chamber to transfer fluid between the stage and outside of the chamber, wherein the tube comprises a first tubular layer of first material, wherein the first material is a flexible polymer; and a second tubular layer of second material, wherein the second material is configured to reduce permeation of fluid or gas through the tube.

In some embodiments, a tube may be configured to be provided within a vacuum chamber to transfer fluid between a stage and outside of the vacuum chamber, wherein the tube may include a first tubular layer of first material, wherein the first material is a flexible polymer; and a second tubular layer of second material, wherein the second material is configured to reduce permeation of fluid or gas through the tube.

In some embodiments, a method for forming a tube within a vacuum chamber for transferring fluid between a stage and outside of the vacuum chamber may be provided. The method may include forming a first tubular layer of first material, wherein the first material is a flexible polymer; forming a second tubular layer of second material over the first tubular layer, wherein the second material is configured to reduce permeation of fluid or gas through the tube; and applying a negative bias to the tube via a conductive structure during plasma deposition of the second tubular layer.

In some embodiments, a system may include a stage configured to secure a wafer; a chamber configured to house the stage and wherein the chamber is configured to operate in a vacuum environment; a first tube provided within the chamber and configured to transfer fluid between the stage and outside of the chamber; and a degasser system provided outside the chamber. The degasser system may include a housing comprising a plurality of second tubes, wherein the housing is configured to receive the transfer fluid, and a vacuum system configured to remove gases from the transfer fluid before the transfer fluid enters the first tube.

DETAILED DESCRIPTION

Figure 1:
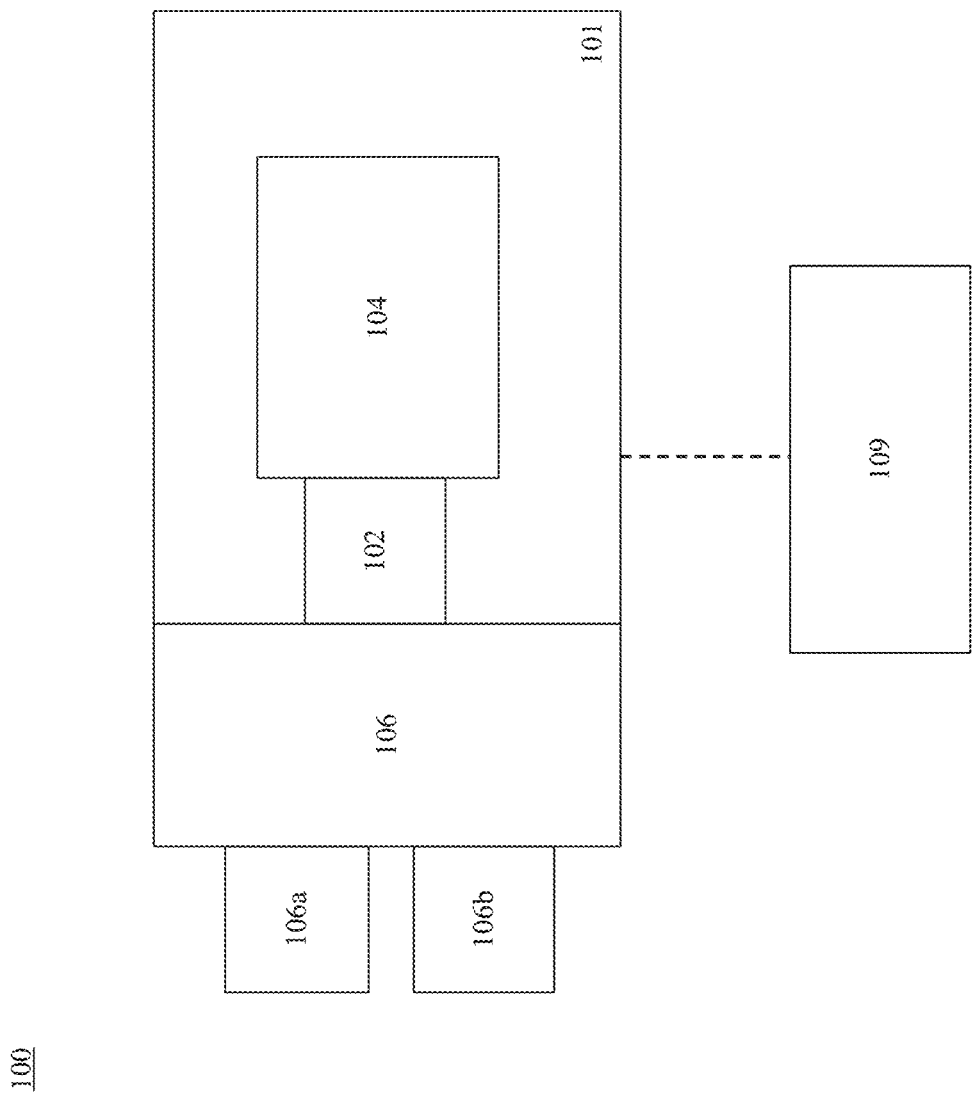
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than $\frac{1}{1000}$th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection may be carried out using a scanning electron microscope (SEM). A SEM can be used to image these extremely small structures, in effect, taking a "picture" of the structures of the wafer. The image can be used to determine if the structure was formed properly and also if it was formed at the proper location. If the structure is defective, then the process can be adjusted so the defect is less likely to recur.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

Inspection involves moving a stage that secures a wafer inside a vacuum chamber. However, the motors used to move the stage often dissipate high amounts of heat. Exposing a wafer to excessive heat for extended periods of time may cause the wafer to expand with structures on the wafer resultantly drifting away from a target position due to the expansion of the wafer. Such thermal drift of the wafer may cause fatal errors when manufacturing the computer chip or locating a defect on the wafer. Even slight changes in temperature may cause the area of interest to rapidly drift out of the field of view of a SEM image, making it challenging to acquire images and analytical data from the area, thus adversely affecting the throughput and inspection yield. In addition, heat exposure to neighboring opto-electric components, such as position sensors, mirrors, motors, etc. can cause stage positioning error and beam placement accuracy error.

A SEM may operate in a vacuum chamber environment. When the SEM prepares for or operates in the vacuum environment, however, water vapor or air molecules may leak into the vacuum chamber from other system components, the result of which may not be desirable for a number of reasons. One is that the leakage may cause the vacuum chamber to take longer to get to a predetermined pressure before inspection of a wafer may occur, thereby slowing throughput, or even preventing the vacuum chamber from being able to reach the predetermined pressure. For example, in a vacuum environment, water vapor or air molecules may leak from fluid transfer tubes used to cool the stage into the vacuum chamber. When water vapor or air molecules leak into the vacuum chamber, the pressure of vacuum chamber may increase, thereby preventing the vacuum chamber from reaching the predetermined pressure needed for inspection. This prolonged time (e.g., pump down time) for the system to reach the predetermined pressure may reduce system availability.

Additionally, water vapor and air molecules may reduce the life of the inspection system due to components sensitive to such contaminants in the system (e.g., pure aluminum components, high voltage components, charged particle source component, etc.). Thus, the ability to prevent water vapor and air molecules from entering the vacuum chamber is crucial to increasing the throughput and life of the inspection system. The choice of material for the fluid transfer tubes may be crucial to retaining fluids and gases. The fluid transfer tubes should also be flexible to accommodate a moving stage while preventing any water vapor or gas molecules from escaping into the vacuum chamber. In some embodiments, the use of a degasser system can be used to remove dissolved gases from the fluids before the fluids enter the tube or tubes within the vacuum chamber to help minimize gases from leaking into the vacuum chamber.

This disclosure describes, among others, methods and systems for providing a flexible fluid transfer tube for cooling a wafer stage while retaining the fluid and gases transferred. This disclosure also describes, among others, methods and systems for providing a degasser system outside the vacuum chamber for removing gases from the fluids before the fluids enter the tube or tubes within the vacuum chamber. In some embodiments, a degasser system may be provided inside of the vacuum chamber. In some embodiments, the inspection system may include a stage configured to secure a wafer, a vacuum chamber that houses the stage, and a plurality of tubes inside the chamber that transfer water or other fluids or gases between the stage and outside the chamber to a fluid cabinet or other components inside or outside of the system. In some embodiments, each tube may include a flexible polymer base that is coated by inorganic or metal materials. A negative bias may be applied to the flexible polymer base during plasma deposition to accelerate the coating ions so that the coating ions may penetrate into the top layers of the flexible polymer base, thereby increasing retention of the transfer fluid. In some embodiments, each tube may include a combination of hydrophobic or hydrophilic materials that may retain water vapor and gases in the fluid. In some embodiments, a multi-beam inspection system may be used. In some embodiments, a degasser system may be provided outside the vacuum chamber. The degasser system may include a vacuum pump system configured to remove gases from the fluids before the fluids enter the tube or tubes within the vacuum chamber. The degasser system may be used in conjunction with a single layer tube within the vacuum chamber or with a multilayer tube within the vacuum chamber, as described above. The inspection system may adapt to multiple applications that optimize throughput of the inspection system.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A. or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1. EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
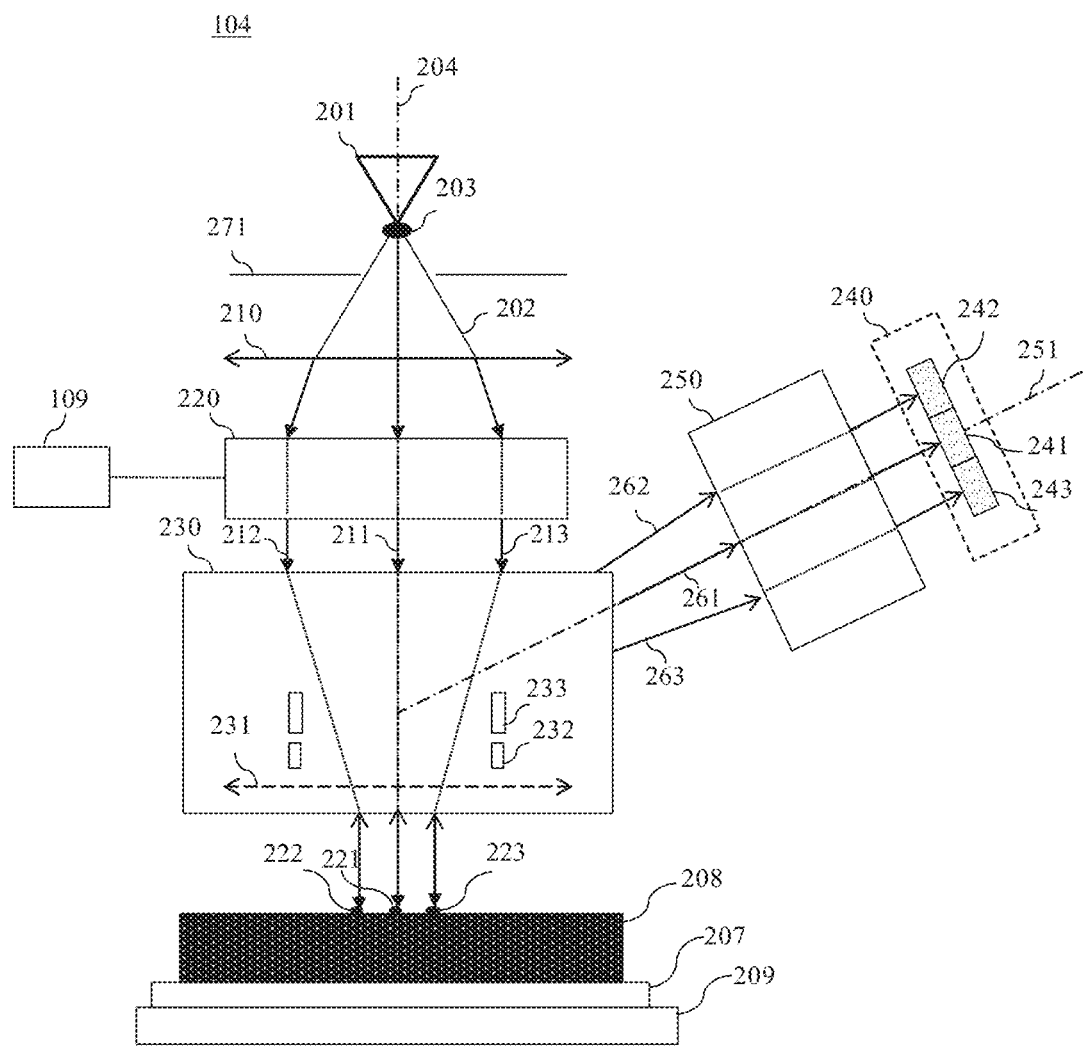
FIG. 2 is a schematic diagram illustrating an exemplary multi-beam system that is part of the exemplary charged particle beam inspection system of FIG. 1, consistent with embodiments of the present disclosure.

Reference is now made to FIG. 2, which is a schematic diagram illustrating an exemplary electron beam tool 104 including a multi-beam inspection tool that is part of the EBI system 100 of FIG. 1, consistent with embodiments of the present disclosure. In some embodiments, electron beam tool 104 may be operated as a single-beam inspection tool that is part of EBI system 100 of FIG. 1. Multi-beam electron beam tool 104 (also referred to herein as apparatus 104) comprises an electron source 201, a Coulomb aperture plate (or "gun aperture plate") 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, Coulomb aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiments, apparatus 104 may be operated as a single-beam system such that a single primary beamlet is generated. In some embodiments, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Coulomb aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), e.g., to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 2 shows that apparatus 104 uses three primary electron beams, it is appreciated that apparatus 104 may use two or more number of primary electron beams. The present disclosure does not limit the number of primary electron beams used in apparatus 104. In some embodiments, apparatus 104 may be a SEM used for lithography.

Compared with a single charged-particle beam imaging system ("single-beam system"), a multiple charged-particle beam imaging system ("multi-beam system") may be designed to optimize throughput for different scan modes. Embodiments of this disclosure provide a multi-beam system with the capability of optimizing throughput for different scan modes by using beam arrays with different geometries, adapting to different throughputs and resolution requirements.

A non-transitory computer readable medium may be provided that stores instructions for a processor (e.g., processor of controller 109 of FIGS. 1-2) to carry out image processing, data processing, beamlet scanning, database management, graphical display, operations of a charged particle beam apparatus, or another imaging device, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Figure 3A:
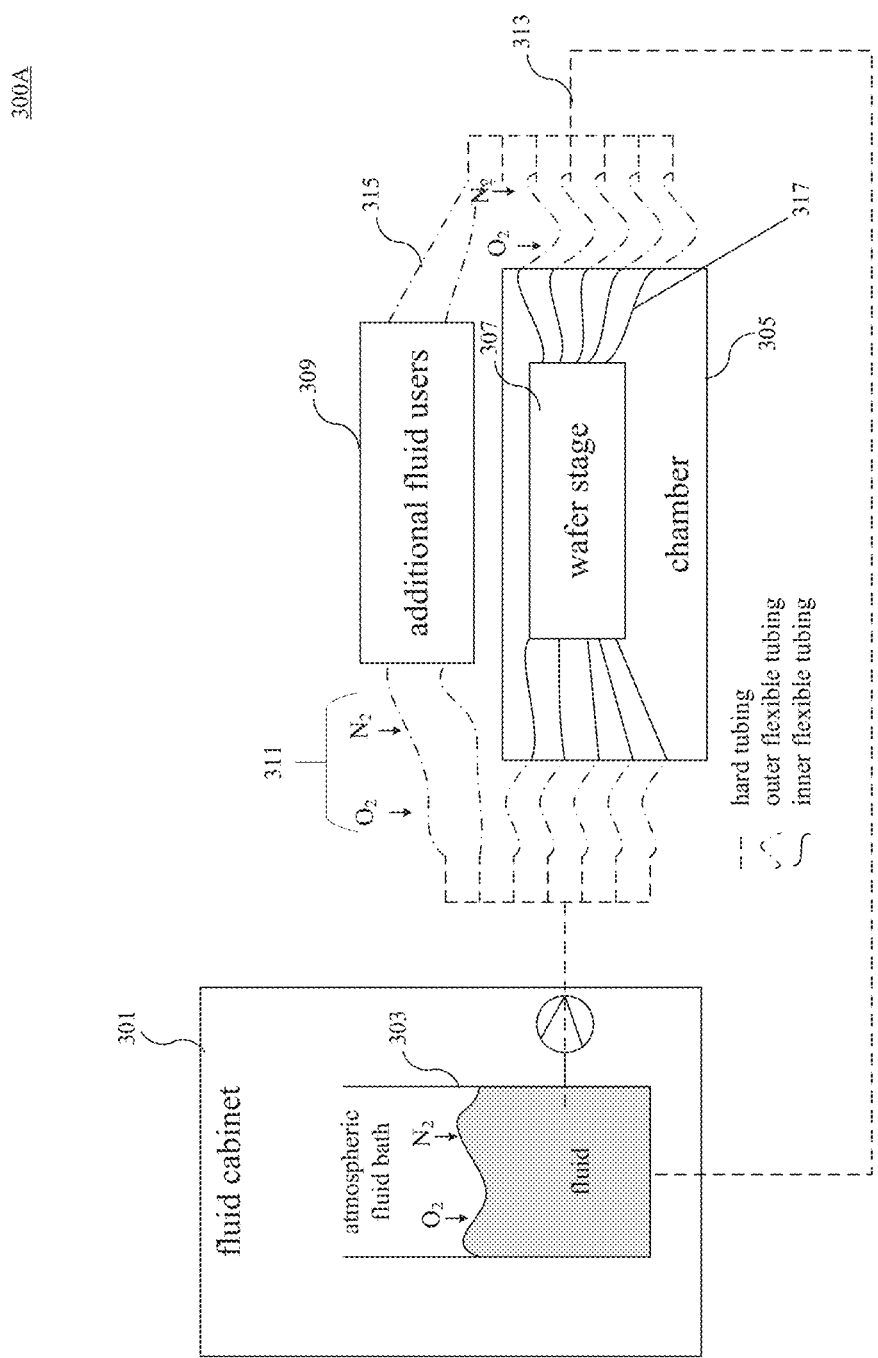
FIG. 3A is a schematic diagram illustrating an exemplary fluid transfer system that is part of the exemplary multi-beam system of FIG. 2, consistent with embodiments of the present disclosure.

Reference is now made to FIG. 3A, a schematic diagram illustrating an exemplary fluid transfer system 300A that is part of the exemplary multi-beam system of FIG. 2, consistent with embodiments of the present disclosure. Fluid transfer system 300A may include a fluid cabinet 301 that transfers fluid (e.g., water, glycol, mixture of water and glycol, etc.) into and out of an atmospheric fluid bath 303. Fluid cabinet 301 and fluid bath 303 may be components of or separate from the exemplary multi-beam system of FIG. 2. Fluid cabinet 301 may include a heat exchanger, pump, valve, or other components that may be used to provide fluid to a wafer stage 307 for purposes such as cooling wafer stage 307 or holding a wafer to wafer stage 307. Wafer stage 307 may be the same component as motorized stage 207 of FIG. 2.

Fluid cabinet 301 may transfer fluid from fluid bath 303 to hard tubing 313 (e.g., metal). Hard tubing 313 may be connected to outer flexible tubing 315 (e.g., polyurethane), which may transfer the fluid to vacuum chamber 305 or to additional systems or components 309 inside or outside of the system. The fluid may be transferred from outer flexible tubing 315 to an inner flexible tubing 317 inside vacuum chamber 305. Wafer stage 307 may be cooled by the fluid transferred through inner flexible tubing 317. Accordingly, the fluid may be transferred through inner flexible tubing 317 to outer flexible tubing 315 outside chamber 305, to hard tubing 313, and back to fluid cabinet 301 in a continuous cycle until cooling completes and pump down begins.

The fluid that transfers through hard tubing 313 may be retained in hard tubing 313 due to the low permeability of hard tubing 313. However, due to the air molecules (e.g., O2, N2, etc.) in atmospheric fluid bath 303, air molecules may permeate into outer flexible tubing 315, thereby entering vacuum chamber 305 through inner flexible tubing 317. Additionally, due to the porosity and crystal structure of outer flexible tubing 315, air molecules 311 may permeate into outer flexible tubing 315, thereby entering vacuum chamber 305 through inner flexible tubing 317. In ambient and low-pressure systems, inner flexible tubing 317 may be made of polytetrafluoroethylene (PTFE). However, PTFE may not be preferred in high and ultra-high vacuum applications, such as some embodiments of water-cooling of fast wafer stages for a multi-beam system. Due to the porosity and crystal structure of PTFE, PTFE has a high permeability for air molecules, especially when a pressure gradient is established between the inside of inner flexible tubing 317 and vacuum chamber 305. Thus, when PTFE is used for inner flexible tubing 317 in high vacuum applications, air molecules may permeate into vacuum chamber 305.

Figure 3B:
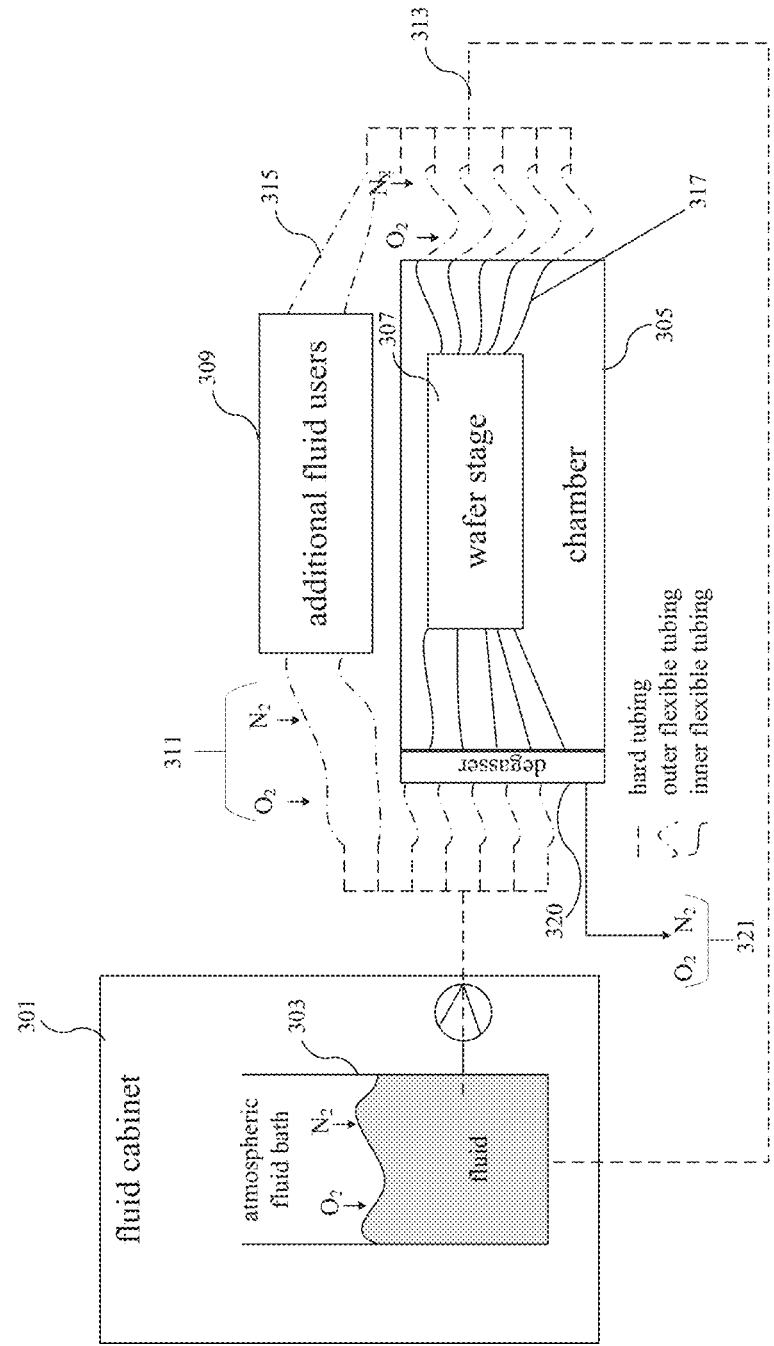
FIG. 3B is a schematic diagram illustrating an exemplary fluid transfer system that is part of the exemplary multi-beam system of FIG. 2, consistent with embodiments of the present disclosure.

Reference is now made to FIG. 3B, a schematic diagram illustrating an exemplary fluid transfer system 300B that is part of the exemplary multi-beam system of FIG. 2, consistent with embodiments of the present disclosure. Fluid transfer system 300B may include components from and operate in a manner similar to fluid transfer system 300A of FIG. 3A described above.

Fluid transfer system 300B may include a degasser system 320 provided outside of vacuum chamber 305. In some embodiments, degasser system 320 may be provided inside of vacuum chamber 305. Degasser system 320 may be configured to receive transfer fluid from outer flexible tubing 315 and remove air molecules 321 from the transfer fluid before the transfer fluid enters inner flexible tubing 317 inside vacuum chamber 305. In some embodiments, a single degasser system may be positioned outside of fluid cabinet 301. In some embodiments, a plurality of degasser systems, one degasser system for each of a plurality of outer flexible tubing 315, may be provided. In some high and ultra-high vacuum applications, such as water-cooling of a fast wafer stage of a multi-beam system, inner flexible tubing 317 may be made of PTFE. The high permeability for air molecules of PTFE may not result in gases leaking into chamber 305 since degasser system 320 may remove gases (e.g., O2, N2, etc.) from the transfer fluid before the transfer fluid enters vacuum chamber 305. In some embodiments, inner flexible tubing 317 may be a multilayer fluid transfer tube (e.g., tube 600 of FIG. 6).

Figure 3C:
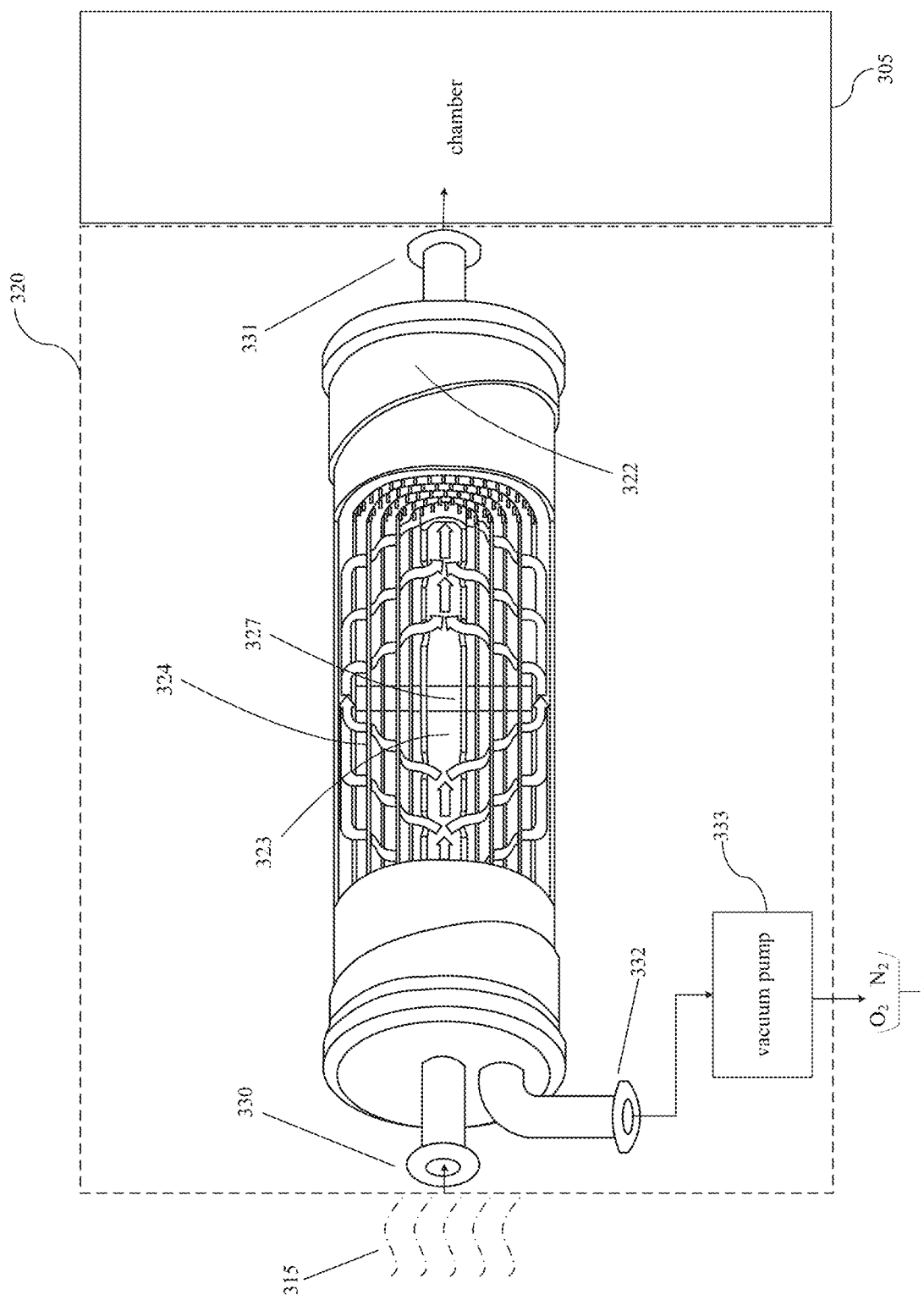
FIG. 3C is a schematic diagram illustrating an exemplary degasser system that is part of the exemplary fluid transfer system of FIG. 3B, consistent with embodiments of the present disclosure.
Figure 3D:
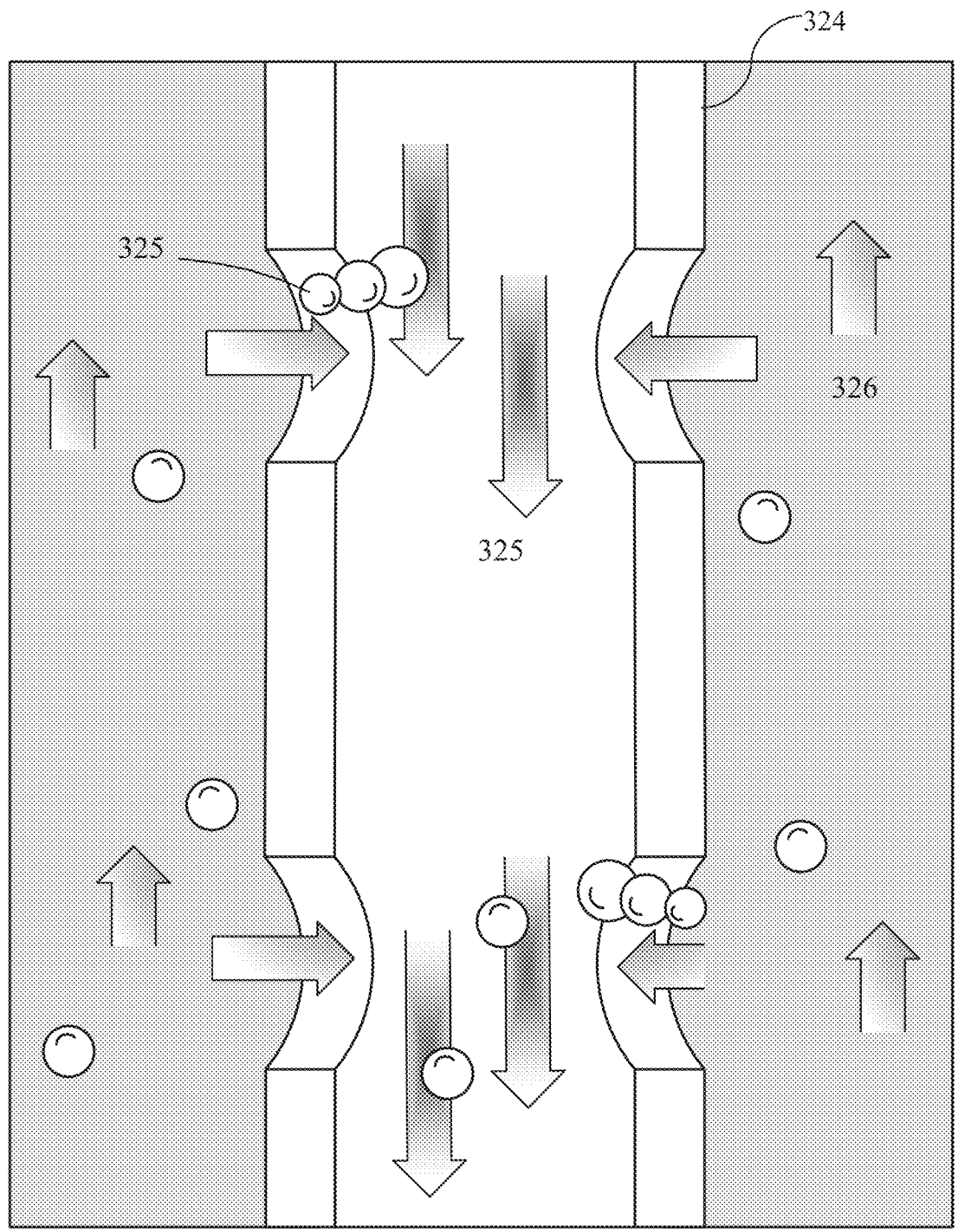
FIG. 3D is an illustration of a hollow fiber membrane tube, consistent with embodiments of the present disclosure.

Reference is now made to FIG. 3C, a schematic diagram illustrating an exemplary degasser system 320 that is part of exemplary fluid transfer system 300B of FIG. 3B and is also made to FIG. 3D, an illustration of hollow fiber membrane tube 324, consistent with embodiments of the present disclosure. As shown in FIG. 3C, degasser system 320 may include a housing 322 that may include a plurality of hollow fiber membrane tubes 324 (e.g., polypropylene), a collection tube 323, and a baffle 327. The plurality of hollow fiber membrane tubes 324 may provide a large surface area for liquid-gas contact inside housing 322. The transfer fluid may flow from outer flexible tubing 315 into a fluid inlet 330 of housing 322. Baffle 327 may force the transfer fluid to flow radially over hollow fiber membrane tubes 324 to maximize membrane surface area contact with the transfer fluid. The transfer fluid may flow through collection tube 323 and around the outer surfaces of hollow fiber membrane tubes 324. The transfer fluid may flow through collection tube 323 to outside of housing 322 from a fluid outlet 331 into chamber 305.

Degasser system 320 may also include a vacuum pump system 333. Vacuum pump system 333 may connect to housing 322 via gas outlet 332 such that gases may flow from inside hollow fiber membrane tubes 324 to gas outlet 332. For example, vacuum pump system 333 may operate such that the gasses inside hollow fiber membrane tubes 324 may flow in a counter-current direction. The counter-current flow of the gasses inside hollow fiber membrane tubes 324 may offset the equilibrium between the liquid phase and the gas phase of the transfer fluid such that a pressure gradient is established between the inside and the outside of hollow fiber membrane tubes 324, where the inside of hollow fiber membrane tubes 324 may have low pressure (or low gas concentration) and the outside of hollow fiber membrane tubes 324 may have high pressure (or high gas concentration). In some embodiments, hollow fiber membrane tube 324 may be configured such that they elongate in a direction perpendicular to the length of housing 322 so that no baffle 327 is needed in degasser system 320. In some embodiments, a strip gas may be applied in an additional inlet to housing 322 so that the strip gas may flow inside hollow fiber membrane tubes 325 to improve the efficiency of gas removal of a particular gas species. For example, applying a N2 strip gas may improve the efficiency of removing O2 from the transfer fluid.

As shown in FIG. 3D, due to the pressure gradient (or gas concentration gradient) established between the inside and outside of hollow fiber membrane tubes 324, gases 325 that are dissolved in transfer fluid 326 may transfer from outside (high pressure side) of hollow fiber membrane tubes 324 to inside (low pressure side) of hollow fiber membrane tubes 324. Gases 325 (e.g., air molecules 321) may continue to transfer through hollow fiber membrane tubes 324 to gas outlet 332 towards vacuum pump system 333 (low pressure side).

In some embodiments, vacuum pump system 333 may be a vacuum pump. In some embodiments, vacuum pump system 333 may be an air-driven vacuum pump. When vacuum pump system 333 is an air-driven vacuum pump, vacuum pump system 333 may compress air such that compressed air flows across the opening of gas outlet 332. The air-driven vacuum pump may operate per Bernoulli's principle such that as the velocity of the compressed air is increased, the pressure of vacuum pump system 333 decreases, thereby creating a vacuum environment.

In some embodiments, degasser system 320 may include a plurality of degasser systems, one degasser system per outer flexible tubing 315, to increase the efficiency of gas removal from the transfer fluid. In some embodiments, the flow rate of the transfer fluid may be adjusted to reduce the flow rate so that a greater amount of dissolved gases may be removed from the transfer fluid. Reducing the flow rate of the transfer fluid may allow the transfer fluid to spend more time in degasser system 320, thereby increasing the amount of dissolved gases removed from the transfer fluid.

Figure 4A:
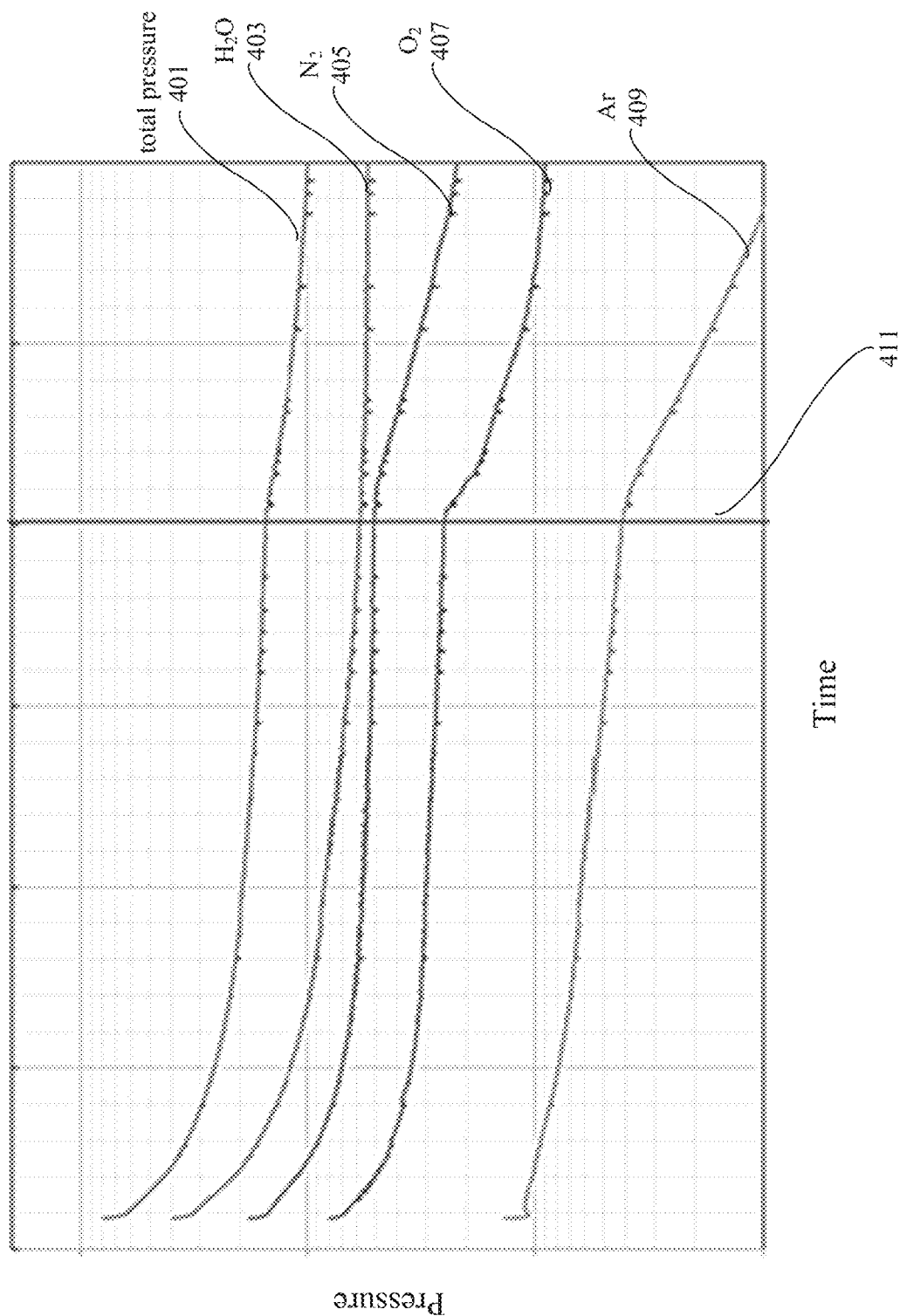
FIG. 4A is a graph illustrating an exemplary relationship between time and pressure within a vacuum chamber.

Reference is now made to FIG. 4A, a graph illustrating an exemplary relationship between time and pressure within a vacuum chamber (e.g., vacuum chamber 305 of FIG. 3A). As shown in FIG. 4A, the horizontal axis denotes time and the vertical axis denotes the pressure inside a vacuum chamber. A time 411 of 40 hours indicates the time at which the system may stop the flow of circulating water as a test, indicating static water inside the PTFE fluid transfer tube. Total pressure 401 inside the vacuum chamber is shown, as well as H2O (water) partial pressure 403, N2 (component of air) partial pressure 405, O2 (component of air) partial pressure 407, and Ar (component of air) partial pressure 409. It should be noted that under actual conditions, the system may not stop the flow of circulating water.

As shown in FIG. 4A, at time 411, water partial pressure 403 remains constant while nitrogen partial pressure 405, oxygen partial pressure 407, and argon partial pressure 409 drop. The drop in partial pressure for nitrogen, oxygen, and argon at time 411 may be indicative of a drop in the number of air molecules escaping the PTFE fluid transfer tube and entering the surrounding vacuum chamber since at time 411, the circulation of water to and from a fluid cabinet (e.g., fluid cabinet 301 of FIG. 3A) is closed. The closed water circulation may result in less air molecules escaping the PTFE fluid transfer tube since air molecules may leave the system with the water and no new air molecules may enter the system after water circulation closes. Thus, the high permeability of air molecules through PTFE under a pressure gradient may be seen in FIG. 4A.

Figure 4B:
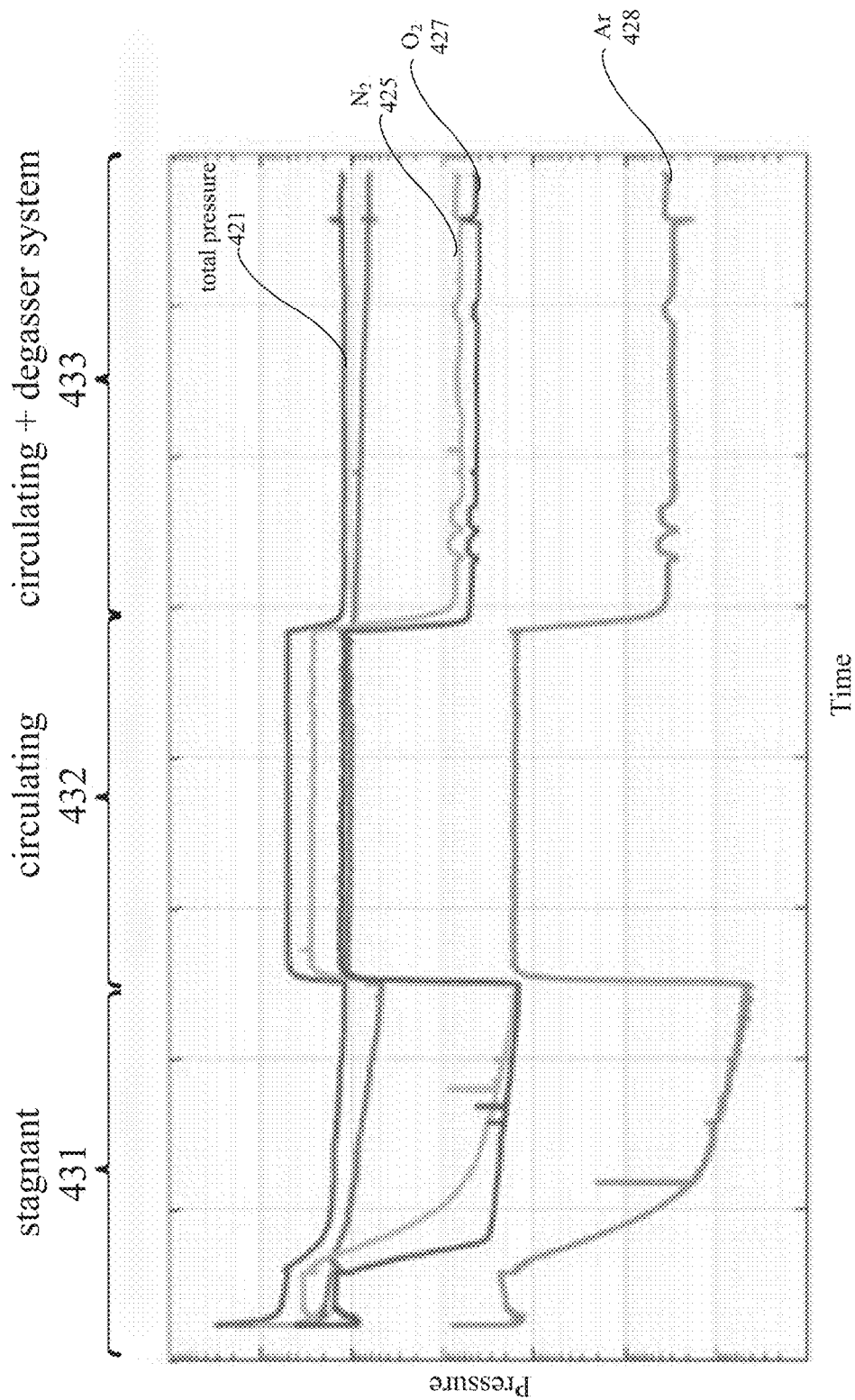
FIG. 4B is a graph illustrating an exemplary relationship between time and pressure within a vacuum chamber.

Reference is now made to FIG. 4B, a graph illustrating an exemplary relationship between time and pressure within a vacuum chamber (e.g., vacuum chamber 305 of FIG. 3B). This system may include a degasser system (e.g., degasser system 320 of FIG. 3B) between a fluid cabinet (e.g., fluid cabinet 301 of FIG. 3B) and the vacuum chamber. The system may include outer flexible tubing (e.g., outer flexible tubing 315 of FIG. 3B) between the degasser system and the vacuum chamber. As shown in FIG. 4B, the horizontal axis denotes time and the vertical axis denotes the pressure inside a vacuum chamber. A time span 431 indicates the time span during which the system may stop the flow of circulating water as a test, indicating static water inside the PTFE fluid transfer tube. A time span 432 indicates the time span during which the system may start the flow of circulating water. A time span 433 indicates the time span during which the system may implement a degasser system (e.g., degasser system 320 of FIG. 3B) while circulating water. Total pressure 421 inside the vacuum chamber is shown, as well as N2 (component of air) partial pressure 425, O2 (component of air) partial pressure 427, and Ar (component of air) partial pressure 428. It should be noted that under actual conditions, the system may not stop the flow of circulating water.

As shown in FIG. 4B, when the degasser system is implemented between time spans 432 and 433, total pressure 421 and partial pressures 425, 427, and 428 drop. The drop in pressures for nitrogen, oxygen, and argon at the start of time span 433 may be indicative of a drop in the number of air molecules entering the vacuum chamber since at the start of time span 433, the degasser system may remove gases from the transfer fluid before the transfer fluid enters the vacuum chamber.

As shown in FIG. 4B, total pressure 421 may have similar values during time spans 431 and 433. These similar total pressure values may indicate that a substantial number of gas molecules do not enter the vacuum chamber via the outer flexible tubing.

Figure 5:
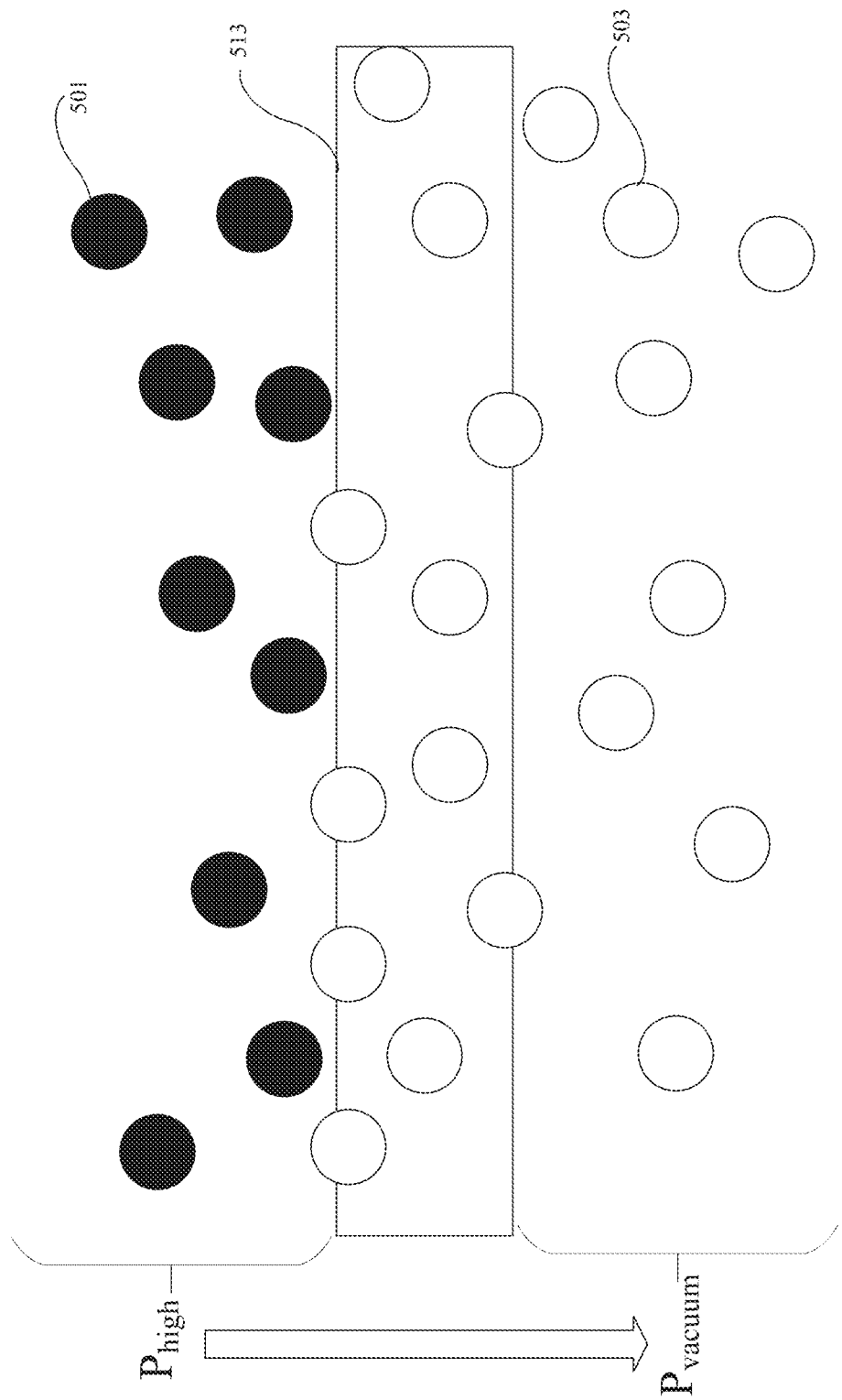
FIG. 5 is an illustration of permeation.

Reference is now made to FIG. 5, an illustration of permeation, consistent with embodiments of the present disclosure. Polymers may be permeable to fluids (e.g., gases, vapors, liquids, etc.) to different extents depending on the nature of the polymer (e.g., chemical composition, degree of crystallinity, molecular weight, etc.) and the fluid (e.g., molecular size, polarity, etc.). The transport of molecules through polymers may be caused by a pressure gradient, a temperature gradient, a concentration gradient, or by an external force field. For example, in a high or ultra-high vacuum system (e.g., vacuum chamber 305 of FIG. 3A), transport of water and gas molecules from inside flexible tubing (e.g., inner flexible tubing 317 of FIG. 3A) to outside flexible tubing may be caused by the pressure or concentration gradient between inside the tubing and inside the vacuum chamber.

The permeation of fluids through polymers may include three steps: (1) solution (absorption) of molecules 501 or 503 into a membrane 513 of the polymer (e.g., inner flexible tubing 317 of FIG. 3A) at the side of higher potential Phigh (e.g., inside inner flexible tubing 317 of FIG. 3); (2) molecular diffusion of the molecules in and through membrane 513; and (3) release (desorption) of the diffused molecules at the opposite side into the fluid at a lower potential Pvacuum (e.g., vacuum chamber 305 of FIG. 3A). The term "permeation" describes the overall mass transport of the penetrant fluid across the membrane, whereas the term "diffusion" describes the movement of the penetrant molecules inside the bulk of the membrane.

The permeability of fluids through polymers may depend on the polarity of the fluids and the polymers. Molecules may include a plurality of bonds. When the electronegativities of two atoms sharing electrons are equal, the two atoms may form a nonpolar bond. When the electronegativities of two atoms sharing electrons are not equal, the atoms are not shared equally and partial ionic charges may form. This unequal sharing of electrons results in a bond dipole, where the bond formed is polar. A molecule is polar if the bond dipoles present in the molecule do not cancel each other out. A molecule is nonpolar if the bond dipoles present in the molecule do cancel each other out. Polar molecules attract, and bond to, other polar molecules due to their partial charges. Nonpolar molecules are left to group together with other nonpolar molecules, forming weak bonds with the other nonpolar molecules while polar molecules attract other polar molecules. Thus, polar molecules may easily permeate through polar membranes, but may not easily permeate through nonpolar membranes. Similarly, nonpolar molecules may easily permeate through nonpolar membranes, but may not easily permeate through polar membranes.

For example, molecule 501 may be polar (e.g., water), molecule 503 may be nonpolar (e.g., N2, O2), and polymer membrane 513 may be nonpolar. In a system with a pressure gradient Phigh to Pvacuum, polar molecules 501 may be retained in the high potential Phigh side of nonpolar membrane 613 while nonpolar molecules 503 may permeate through nonpolar membrane 513.

Water vapor and air molecules in a vacuum chamber (e.g., vacuum chamber 305 of FIG. 3A) may not be desirable for a number of reasons. One is that the pressure in the vacuum chamber may need to reach a predetermined pressure before inspection of a wafer may occur. Water vapor and air molecules that escapes from a flexible tubing (e.g., inner flexible tubing 317 of FIG. 3A) into the vacuum chamber may increase the pressure of the vacuum chamber, thereby preventing the vacuum chamber from falling to the predetermined pressure needed for inspection. This prolonged time (e.g., pump down time) for the system to reach the predetermined pressure may reduce system availability, for example as shown below with respect to comparing curves 801-804A to 801-804B in FIG. 8. Additionally, water vapor and air molecules may reduce the life of the inspection system due to components in the system that are sensitive to contaminants (e.g., pure aluminum components, high voltage components, electron source, etc.). Thus, the choice of material for the flexible tubing is crucial to increasing the throughput and life of the inspection system.

Figure 6:
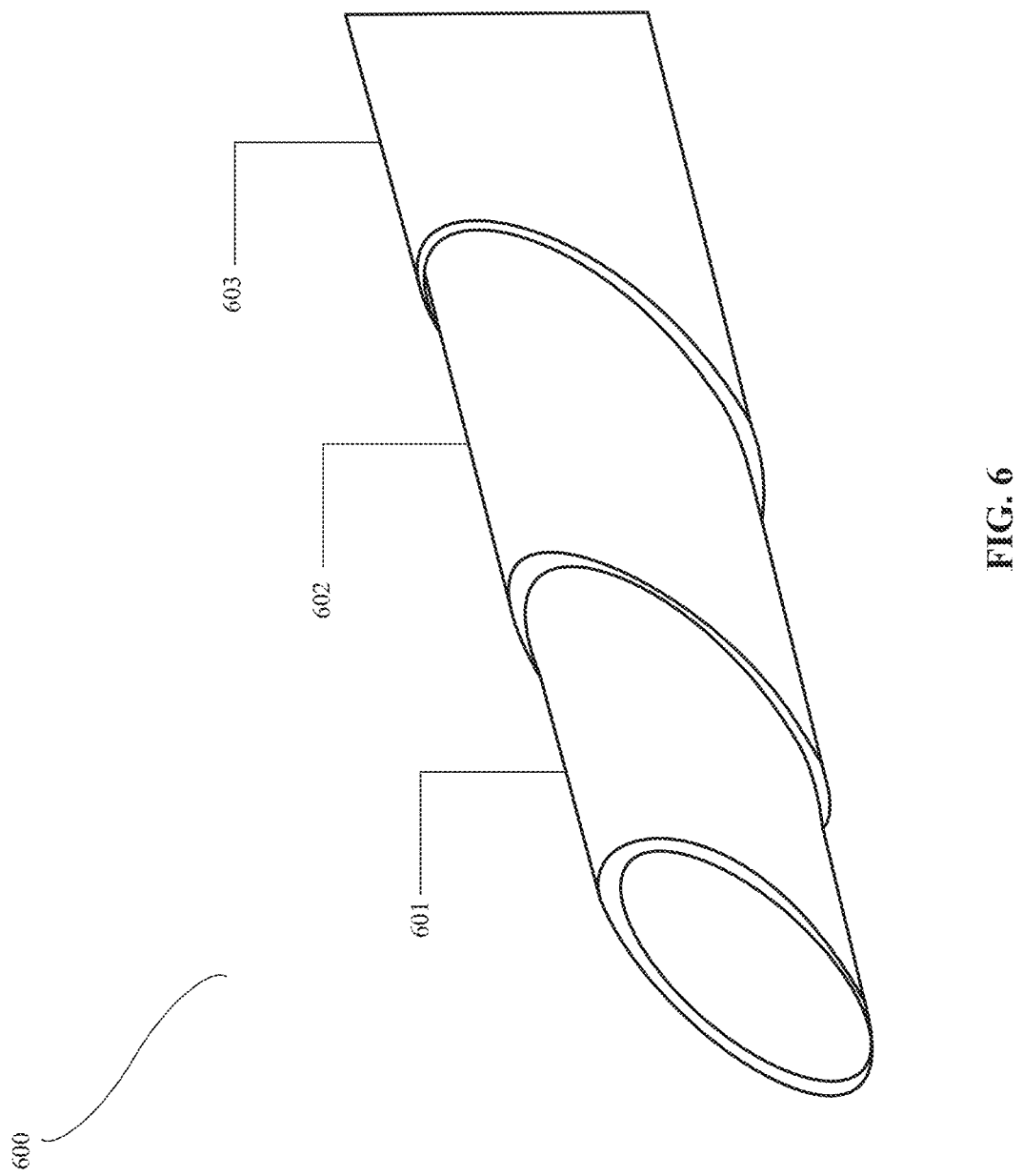
FIG. 6 is an illustration of a multilayer fluid transfer tube, consistent with embodiments of the present disclosure.

Reference is now made to FIG. 6, an illustration of a multilayer fluid transfer tube, consistent with embodiments of the present disclosure. As shown in FIG. 6, a fluid transfer tube 600 (e.g., inner flexible tubing 317 of FIGS. 3A-3B) may include multiple tubular layers (such as layers 601, 602, or 603). It is understood that tube 600 is not limited to the embodiment depicted and may include two layers or more than three layers (e.g., tubular layers).

Due to effective pore penetration, coating flexible polymers with diamond-like-carbon (DLC), ions, or dense polymers may provide a structure that is effectively impermeable to oxygen and water vapor while maintaining a flexible structure for fast wafer stage movement during inspection. Additionally, these coating materials may be designed to improve conductivity or wear-resistance. For example, some flexible polymers (e.g., PTFE) without coatings may be insulative with a high electron affinity, which may lead to electrostatic risk to a system due to high voltage during operation. Effective reduction in permeability of fluid transfer tubes may enable systems (e.g., vacuum chamber 305 of FIGS. 3A-3B) to reach lower pressures in addition to reducing permeation of fluids (e.g., water, air, etc.) from inside the tube to outside the tube into the vacuum chamber.

In some embodiments tube 600 may include only two layers 601 and 602, where layer 601 may be polar and layer 602 may be nonpolar. This embodiment may be preferred to reduce absorption of water vapor or air molecules into tube 600 since water is polar and air molecules are nonpolar. In some embodiments, layer 601 may be nonpolar while layer 602 may be polar. For example, the polar layer may include at least one layer of polyvinylidene chloride (PVDC) or ethylene vinyl alcohol (EVOH) since PVDC and EVOH are polar molecules with low permeability coefficients for oxygen and water (e.g., 0.00425-0.57 cm3-mm/m2-d-atm O2 and 0.025-0.913 g-mm/m2-d water for PVDC and 0.01-0.15 cm3-mm/m2-d-atm O2 and 0.8-2.4 g-mm/m2-d water for EVOH). The nonpolar layer may include at least one layer of PTFE since PTFE is a nonpolar molecule with a low permeability coefficient for water (e.g., 0.0045-0.30 g-mm/m2-d water).

In some embodiments, tube 600 may include three layers 601-603, where layer 601 may be polar, layer 602 may be an adhesion layer, and layer 603 may be nonpolar. In some embodiments, layer 601 may be nonpolar while layer 603 may be polar. In some situations, having at least three layers may be preferred to increase adhesion between layers 601 and 603, thereby increasing the robustness of tube 600 and reducing the permeability of water vapor or air molecules through tube 600. As described above, water is polar and air molecules are nonpolar. A polar layer may include at least one layer of PVDC or EVOH since PVDC and EVOH are polar molecules. A nonpolar layer may include at least one layer of PTFE since PTFE is a nonpolar molecule. An adhesion layer may include at least one layer of polyimide.

In some embodiments, tube 600 may include two layers 601 and 602, where 602 coats 601. For example, layer 601 may include at least one flexible polymer base (e.g., PTFE, polyethylene terephthalate, etc.) and layer 602 may include a DLC coating, a metal coating (e.g., Cr, Al, etc.), a metal-oxide coating (e.g., AlOx), a semi-metal-oxide coating (e.g., SiOx), or a dense polymer coating (e.g., polyimide/Kapton, polyvinylidene fluoride, etc.). In some situations, this layer configuration may preferred to reduce molecular diffusion of water vapor or air molecules in and through tube 600. The coating layer 602 may fill pores of layer 601, thereby reducing permeation of water vapor or air molecules through tube 600 at the diffusion stage of permeation. In some embodiments, layer 602 may include a DLC coating or a metal coating that is applied to layer 601 under a negative bias by inserting a conductive structure (e.g., wire) into layer 601. The negative bias may be applied during plasma deposition of layer 602 to accelerate the coating of the ions and cause the coating ions to penetrate into the top layers of layer 601, thereby plugging the interstitial sites and pores of layer 601 to reduce fluid permeability into tube 600. In some embodiments, each DLC coating, metal coating, metal-oxide coating, or semi-metal-oxide coating may have a thickness of 10-50 nm so as not to impact mechanical properties of tube 600. In some embodiments tube 600 may include at least one adhesion layer. In some embodiments, at least one layer of PVDC or EVOH may be inside or outside of layer 601 and coating layer 602.

Figure 7:
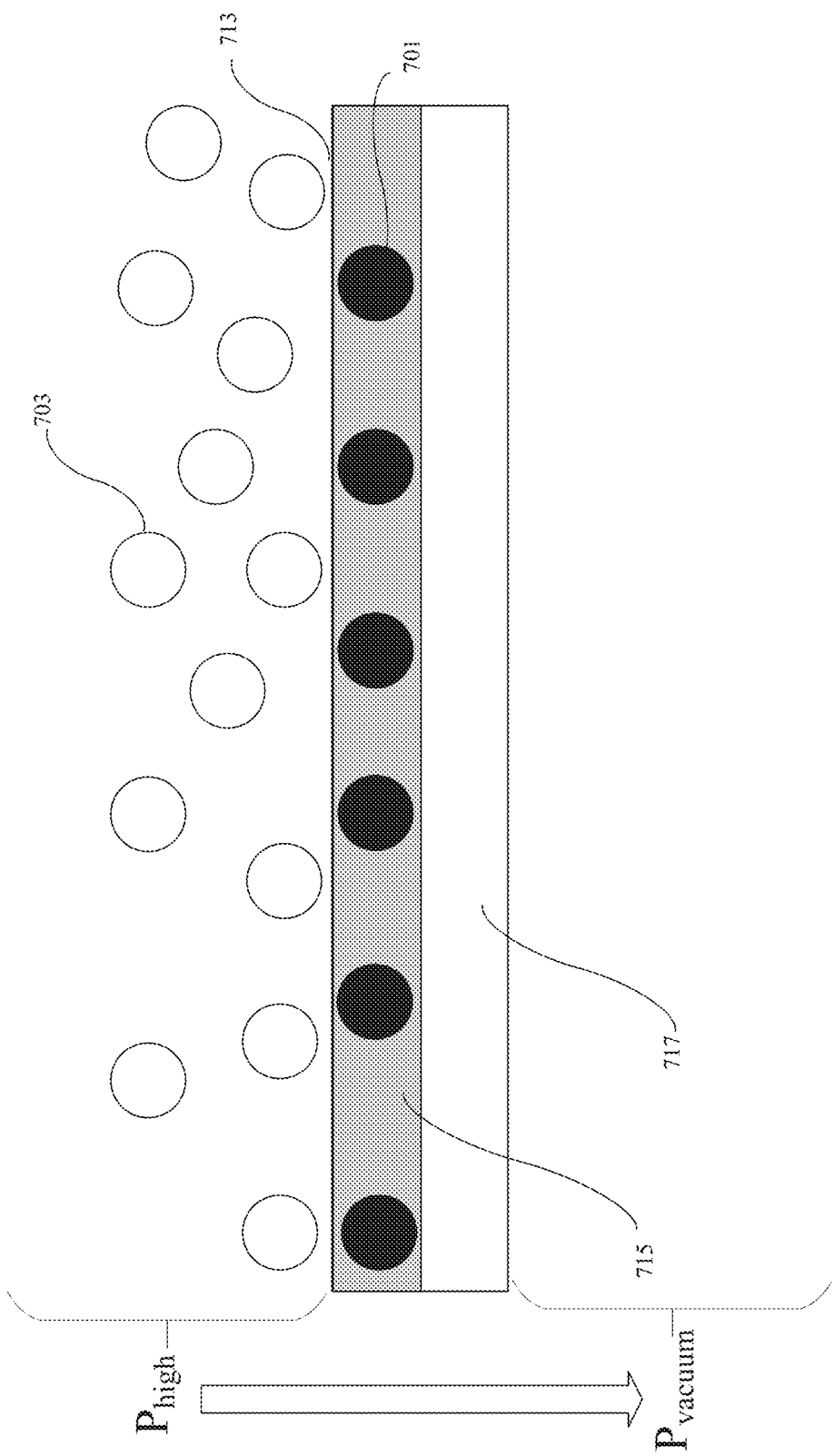
FIG. 7 is an illustration of permeation, consistent with embodiments of the present disclosure.

Reference is now made to FIG. 7, an illustration of permeation, consistent with embodiments of the present disclosure. Similar to FIG. 5, an environment may have polar molecules 701 and nonpolar molecules 703. A polymer membrane 713 may include two or more layers, including polar layer 715 and nonpolar layer 717. In a system with a pressure gradient Phigh to Pvacuum, nonpolar molecules 703 may be retained in the high potential Phigh side of polar layer 715 while polar molecules 701 may permeate through polar layer 715. However, polar molecules 701 may be retained in polar layer 715 due to nonpolar layer 717. Thus, molecules 701 and 703 may be prevented from escaping into the low potential side Pvacuum of membrane 713. In some embodiments, layers including nonpolar (or hydrophobic) molecules (e.g., PTFE) may have a water contact angle of greater than 90 degrees. In some embodiments, layers including polar (or hydrophilic) molecules (e.g., PVDC, EVOH, etc.) may have a water contact angle of less than 90 degrees.

Reducing the permeation of molecules 701 and 703 (e.g., water vapor, air molecules, etc.) may be advantageous in reducing the pressure inside a vacuum chamber system (e.g., vacuum chamber 305 of FIGS. 3A-3B). The pressure inside the vacuum chamber may be lower in a system where no fluids or gases escape the fluid transfer tube since system pressure may increase with an increase of gas molecules in the system (e.g., curves 801-804B of FIG. 8). In a system where no fluids or gases escape the fluid transfer tube, the pressure of the vacuum chamber may reach lower pressures in a shorter amount of time since system pressure may be reduced with a reduced amount of gas molecules. Reducing the pressure of the vacuum chamber in a shorter amount of time may allow a charged particle system (e.g., EBI system 100 of FIG. 1) to use high voltage sooner (e.g., line 813 of FIG. 8) and to collect inspection measurements sooner (e.g., line 815 of FIG. 8). Thus, reducing the pressure of the vacuum chamber in a shorter amount of time may optimize and prolong the life of an inspection system. For example, using a fluid transfer tube that reduces permeation of water vapor and air molecules into a vacuum chamber may shorten the pump down time from 40 hours to 16 hours. Additionally, using this fluid transfer tube may reduce the final vacuum chamber pressure, thereby increasing the lifetime of the inspection system.

Figure 8:
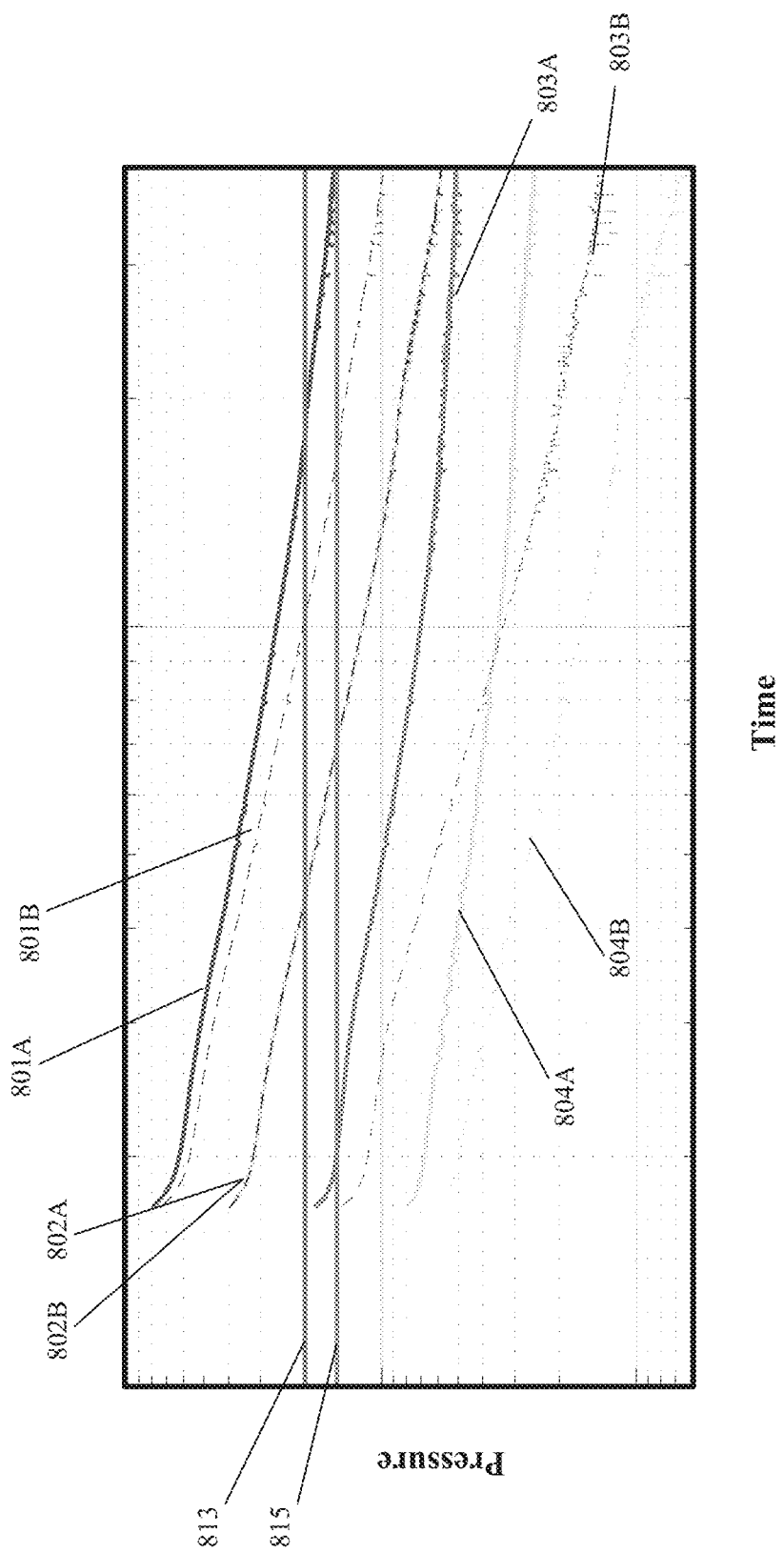
FIG. 8 is a graph illustrating an exemplary relationship between time and pressure within a vacuum chamber.

Reference is now made to FIG. 8, a graph illustrating an exemplary relationship between time and pressure within a vacuum chamber (e.g., vacuum chamber 305 of FIGS. 3A-3B). As shown in FIG. 8, the horizontal axis denotes time in hours and the vertical axis denotes the pressure inside vacuum chamber. Curves 801A, 802A, 803A, and 804A are measured pressures inside the vacuum chamber when PTFE tubing is used for the flexible tubing (e.g., inner flexible tubing 317 of FIG. 3) inside the vacuum chamber without a degasser system while curves 801B, 802B, 803B, and 804B are estimated pressures inside the vacuum chamber when a multilayer transfer tube (e.g., fluid transfer tube 600 of FIG. 6) is used for the flexible tubing inside the vacuum chamber or when a degasser system (e.g., degasser system 320 of FIG. 3B) is used. Curves 801A and 801B are the total pressures inside the vacuum chamber, curves 802A and 802B are the partial pressures of water inside the vacuum chamber, curves 803A and 803B are the partial pressures of nitrogen in the vacuum chamber, and curves 804A and 804B are the partial pressures of oxygen inside the vacuum chamber. As shown by curves 801-804B, the pressure inside the vacuum chamber may be lower in a system that uses a multilayer transfer tube since no fluids or gases may escape the multilayer transfer tube, which may use a combination of polar and nonpolar layers. The pressure inside the vacuum chamber may also be lower in a system that uses a single layer tube with a degasser system since dissolved gases may be removed from the transfer fluid before the transfer fluid enters the vacuum chamber. The pressure inside the vacuum chamber may be lower in a system where no fluids or gases escape the multilayer transfer tube since system pressure may increase with an increase of gas molecules in the system, as shown by curves 801-804A. Similarly, the pressure inside the vacuum chamber may be lower in a system where dissolved gases are removed from the transfer fluid before the transfer fluid enters the vacuum chamber. For example, as shown by curves 803A and 804A, gases (e.g., N2, O2, etc.) may escape flexible tubing that uses PTFE since PTFE is nonpolar when a degasser system is not used. Accordingly, as shown by curves 802A and 802B, water retention in the flexible tubing may be the same when either PTFE or a multilayer transfer tube is used since PTFE is nonpolar.

Line 813 is the maximum pressure at which a charged particle system (e.g., EBI system 100 of FIG. 1) may use high voltage. A charged particle system may need to perform inspections under high voltage, so the quicker the vacuum chamber pressure falls below line 813, the sooner the charged particle system may operate under high voltage, thus increasing system throughput. Line 815 is the maximum pressure at which a charged particle system may collect inspection measurements. A multilayer transfer tube with a combination of polar and nonpolar layers, a single layer transfer tube with a degasser system, or a combination thereof may be desirable since the quicker the vacuum chamber pressure falls below line 815, the sooner the charged particle system may perform inspection. Thus, system throughput may increase if the vacuum chamber pressure reaches line 815 sooner. In a system where no fluids or gases escape the fluid transfer tube (e.g., curves 801-804B) or enter the vacuum chamber, the pressure of the vacuum chamber may reach lower pressures in a shorter amount of time (e.g., around 10 hours) since system pressure may be reduced with a reduced amount of gas molecules. Thus, when gas molecules are retained inside the fluid transfer tube or removed from the transfer fluid before entering the vacuum chamber, the pressure of the vacuum chamber may reach lower pressures in a shorter amount of time (e.g., around 10 hours) when compared to systems using conventional tubing (e.g., around 40 hours), thereby allowing the system to provide greater throughput.

As shown in FIG. 8, the choice of material, preferably material that will prevent fluid or gases (e.g., water vapor, air molecules) from escaping into the vacuum chamber, for the fluid transfer tube or the use of a degasser system is important for optimizing and prolonging the life of the inspection system.

Figure 9:
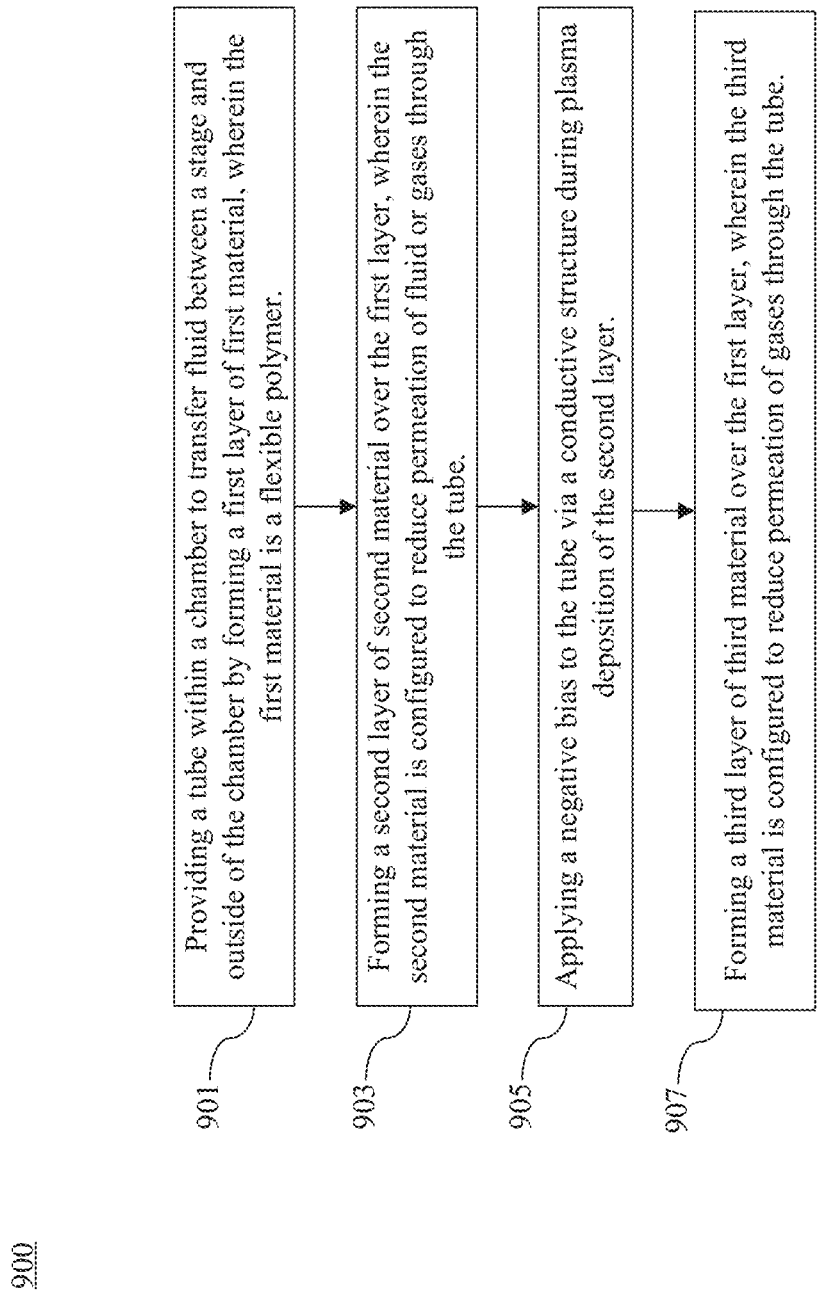
FIG. 9 is a flowchart of an exemplary process of forming a fluid transfer tube, consistent with embodiments of the present disclosure

Reference is now made to FIG. 9, a flowchart illustrating an exemplary method 900 of forming a fluid transfer tube, consistent with embodiments of the present disclosure.

At step 901, a tube (e.g., inner flexible tubing 317 of FIG. 3) provided within a chamber (e.g., vacuum chamber 305 of FIGS. 3A-3B) to transfer fluid (e.g., water) between a stage (e.g., wafer stage 307 of FIGS. 3A-3B) and outside of the chamber may be formed by forming a first layer (e.g., layer 601 of FIG. 6) of first material, wherein the first material is a flexible polymer. The flexible polymer layer may be nonpolar (e.g., PTFE).

At step 903, forming the tube may further include forming a second layer of second material (e.g., layer 602 of FIG. 6) over the first layer, wherein the second material may include a DLC coating, a metal coating (e.g., Cr, Al, etc.), a metal-oxide coating (e.g., AlOx), a semi-metal-oxide coating (e.g., SiOx), or a dense polymer coating (e.g., polyimide/Kapton, polyvinylidene fluoride, etc.). The second material may be configured to reduce permeation of fluid (e.g., water) or gases (e.g., N2, O2) through the tube at the molecular diffusion stage by filling pores of the flexible polymer.

At step 905, a negative bias may be applied to the tube via a conductive structure during plasma deposition of the second layer in order to accelerate the coating of the ions of the second material and cause the coating ions to penetrate into the top layers of the flexible polymer, thereby plugging the interstitial sites and pores of the flexible polymer to reduce fluid permeability into the tube. Reducing fluid permeability into the tube may prevent, for example, water vapor and air molecules from entering a vacuum chamber, thereby allowing the vacuum chamber to reach lower pressures in a shorter amount of time since system pressure may be reduced by reducing the amount of gas molecules. Reducing the pressure of the vacuum chamber in a shorter amount of time may allow a charged particle system (e.g., EBI system 100 of FIG. 1) to use high voltage sooner and to collect inspection measurements sooner, thereby optimizing inspection throughput of the inspection system.

At step 907, forming the tube may further include forming a third layer of third material (e.g., layer 603 of FIG. 6) over the first layer, wherein the third material may include a polar layer (e.g., PVDC, EVOH, etc.). Forming a third layer of a polar third material may reduce absorption of, for example, water vapor or air molecules into the tube, thereby further reducing permeability of water vapor or air molecules into the tube and reducing the pressure of the vacuum chamber in a shorter amount of time.

The embodiments may further be described using the following clauses:

1. A system, comprising:
    a stage configured to secure a wafer;
    a chamber configured to house the stage and wherein the chamber is configured to operate in a vacuum environment; and
    a tube provided within the chamber and configured to transfer fluid between the stage and outside of the chamber, wherein the tube comprises:
        a first tubular layer of first material, wherein the first material is a flexible polymer; and
        a second tubular layer of second material, wherein the second material is configured to reduce permeation of fluid or gas through the tube.
2. The system of clause 1, wherein the flexible polymer comprises polytetrafluoroethylene (PTFE).
3. The system of clause 1, wherein the flexible polymer comprises polyethylene terephthalate (PET).
4. The system of any one of clauses 1-3, wherein the second tubular layer coats the first tubular layer.
5. The system of any one of clauses 1-4, wherein the second material is diamond-like-carbon.
6. The system of any one of clauses 1-4, wherein the second material is a metal-oxide.
7. The system of clause 6, wherein the metal-oxide is an aluminum oxide.
8. The system of any one of clauses 1-4, wherein the second material is a metal.
9. The system of clause 8, wherein the metal is aluminum.
10. The system of clause 8, wherein the metal is chromium.
11. The system of any one of clauses 1-4, wherein the second material is a semi-metal-oxide.
12. The system of clause 11, wherein the semi-metal-oxide is a silicon oxide.
13. The system of any one of clauses 1-4, wherein the second material is a polymer.
14. The system of clause 13, wherein the polymer is a polyimide.

15. The system of clause 13, wherein the polymer is at least one of polyvinylidene fluoride (PVDF), polyvinylidene chloride (PVDC), or ethylene vinyl alcohol (EVOH).
16. The system of any one of clauses 5-12, wherein a thickness of the second tubular layer is 10-50 nanometers.
17. The system of any one of clauses 1, 2, or 4-16, wherein the tube further comprises a third tubular layer of third material, wherein the third material is configured to reduce permeation of gas through the tube.
18. The system of clause 17, wherein the third tubular layer is over the second tubular layer.
19. The system of clause 17, wherein the first tubular layer is over the third tubular layer.
20. The system of any one of clauses 1, 2, or 4-19, wherein the first tubular layer comprises a fluid contact angle greater than 90 degrees.
21. The system of any one of clauses 1, 2, or 4-20, wherein the third tubular layer comprises a fluid contact angle less than 90 degrees.
22. The system of any one of clauses 1-21, wherein the tube further comprises an adhesion layer.
23. The system of clause 1-22, further comprising an adhesion layer between each of the first tubular layer, the second tubular layer, or the third tubular layer.
24. The system of any one of clauses 22 or 23, wherein the adhesion layer comprises polyimide.
25. The system of any one of clauses 17-24, wherein the third material comprises PVDC.
26. The system of any one of clauses 17-24, wherein the third material comprises EVOH.
27. The system of any one of clauses 1-26, wherein the tube is configured to transfer the fluid in a high or ultra-high vacuum system.
28. The system of any one of clauses 1-27, wherein the first tubular layer comprises a plurality of first tubular layers.
29. The system of any one of clauses 1-28, wherein the second tubular layer comprises a plurality of second tubular layers.
30. The system of any one of clauses 17-29, wherein the third tubular layer comprises a plurality of third tubular layers.
31. The system of any one of clauses 1-30, wherein the fluid comprises at least one of water or glycol.
32. The system of any one of clauses 1-31, wherein the gas comprises at least one of oxygen or nitrogen.
33. The system of any one of clauses 1-32, wherein the system further comprises:
    a fluid bath;
    a plurality of hard tubes outside of the chamber to transfer the fluid between the fluid bath and a plurality of polyurethane tubes outside of the chamber; and
    wherein the tube provided within the chamber is configured to transfer the fluid between the plurality of polyurethane tubes and the stage.
34. The system of any one of clauses 1-33, wherein:
    the stage is configured to move in the chamber; and
    and the tube is configured to move with the stage.
35. The system of any one of clauses 1-34, wherein the system comprises a scanning electron microscope system.
36. The system of any one of clauses 1-35, wherein the system comprises a lithography system.
37. The system of any one of clauses 1-36, wherein the tube comprises a plurality of tubes.
38. A tube configured to be provided within a vacuum chamber to transfer fluid between a stage and outside of the vacuum chamber, comprising:
    a first tubular layer of first material, wherein the first material is a flexible polymer; and
    a second tubular layer of second material, wherein the second material is configured to reduce permeation of fluid or gas through the tube.
39. The tube of clause 38, wherein the flexible polymer comprises polytetrafluoroethylene (PTFE).
40. The tube of clause 38, wherein the flexible polymer comprises polyethylene terephthalate (PET).
41. The tube of any one of clauses 38-40, wherein the second tubular layer coats the first tubular layer.
42. The tube of any one of clauses 38-41, wherein the second material is diamond-like-carbon.
43. The tube of any one of clauses 38-41, wherein the second material is a metal-oxide.
44. The tube of clause 42, wherein the metal-oxide is an aluminum oxide.
45. The tube of any one of clauses 38-41, wherein the second material is a metal.
46. The tube of clause 45, wherein the metal is aluminum.
47. The tube of clause 45, wherein the metal is chromium.
48. The tube of any one of clauses 38-41, wherein the second material is a semi-metal-oxide.
49. The tube of clause 47, wherein the semi-metal-oxide is a silicon oxide.
50. The tube of any one of clauses 38-41, wherein the second material is a polymer.
51. The tube of clause 50, wherein the polymer is a polyimide.
52. The tube of clause 50, wherein the polymer is at least one of polyvinylidene fluoride (PVDF), polyvinylidene chloride (PVDC), or ethylene vinyl alcohol (EVOH).
53. The tube of any one of clauses 42-49, wherein a thickness of the second tubular layer is 10-50 nanometers.
54. The tube of any one of clauses 38, 39, or 41-53, wherein the tube further comprises a third tubular layer of third material, wherein the third material is configured to reduce permeation of gas through the tube.
55. The tube of clause 54, wherein the third tubular layer is over the second tubular layer.
56. The tube of clause 54, wherein the first tubular layer is over the third tubular layer.
57. The tube of any one of clauses 38, 39, or 41-56, wherein the first tubular layer comprises a fluid contact angle greater than 90 degrees.
58. The tube of any one of clauses 38, 39, or 41-57, wherein the third tubular layer comprises a fluid contact angle less than 90 degrees.
59. The tube of any one of clauses 38, 39, or 41-58, wherein the tube further comprises an adhesion layer.
60. The tube of any one of clauses 38-59, further comprising an adhesion layer between each of the first tubular layer, the second tubular layer, or the third tubular layer.
61. The tube of any one of clauses 59 or 60, wherein the adhesion layer comprises polyimide.
62. The tube of any one of clauses 54-61, wherein the third material comprises PVDC.
63. The tube of any one of clauses 54-61, wherein the third material comprises EVOH.

64. The tube of any one of clauses 38-63, wherein the tube is configured to transfer the fluid in a high or ultra-high vacuum system.
65. The tube of any one of clauses 38-64, wherein the first tubular layer comprises a plurality of first tubular layers.
66. The tube of any one of clauses 38-65, wherein the second tubular layer comprises a plurality of second tubular layers.
67. The tube of any one of clauses 54-66, wherein the third tubular layer comprises a plurality of third tubular layers.
68. The tube of any one of clauses 38-67, wherein the fluid comprises at least one of water or glycol.
69. The tube of any one of clauses 38-68, wherein the gas comprises at least one of oxygen or nitrogen.
70. A method for forming a tube for use within a vacuum chamber for transferring fluid between a stage and outside of the vacuum chamber, comprising:
    forming a first tubular layer of first material, wherein the first material is a flexible polymer;
    forming a second tubular layer of second material, wherein the second material is configured to reduce permeation of fluid or gas through the tube; and
    applying a negative bias to the tube via a conductive structure during plasma deposition of the second tubular layer.
71. The method of clause 70, wherein the first tubular layer comprises polytetrafluoroethylene (PTFE).
72. The method of clause 70, wherein the first tubular layer comprises polyethylene terephthalate (PET).
73. The method of any one of clauses 70-72, wherein forming the second tubular layer comprises coating the first tubular layer.
74. The method of any one of clauses 70-73, wherein the second material is diamond-like-carbon.
75. The method of any one of clauses 70-73, wherein the second material is a metal-oxide.
76. The method of clause 74, wherein the metal-oxide is an aluminum oxide.
77. The method of any one of clauses 70-73, wherein the second material is a metal.
78. The method of clause 77, wherein the metal is aluminum.
79. The method of clause 77, wherein the metal is chromium.
80. The method of any one of clauses 70-73, wherein the second material is a semi-metal-oxide.
81. The method of clause 80, wherein the semi-metal-oxide is a silicon oxide.
82. The method of any one of clauses 70-73, wherein the second material is a polymer.
83. The method of clause 82, wherein the polymer is a polyimide.
84. The method of clause 82, wherein the polymer is at least one of polyvinylidene fluoride (PVDF), polyvinylidene chloride (PVDC), or ethylene vinyl alcohol (EVOH).
85. The method of any one of clauses 70-84, wherein a thickness of the second tubular layer is 10-50 nanometers.
86. The method of any one of clauses 70, 71, or 73-85, further comprising forming a third tubular layer of third material in the tube, wherein the third material is configured to reduce permeation of gas through the tube.
87. The method of clause 86, wherein the third tubular layer is over the second tubular layer.
88. The method of clause 86, wherein the first tubular layer is over the third tubular layer.
89. The method of any one of clauses 70, 71, or 73-88, wherein the first tubular layer comprises a fluid contact angle greater than 90 degrees.
90. The method of any one of clauses 70, 71, or 73-89, wherein the third tubular layer comprises a fluid contact angle less than 90 degrees.
91. The method of any one of clauses 70-90, further comprising forming an adhesion layer in the tube.
92. The method of any one of clauses 70-91, further comprising forming an adhesion layer between each of the first tubular layer, the second tubular layer, or the third tubular layer.
93. The method of any one of clauses 91 or 92, wherein the adhesion layer comprises polyimide.
94. The method of any one of clauses 86-93, wherein the third material comprises PVDC.
95. The method of any one of clauses 86-93, wherein the third material comprises EVOH.
96. The method of any one of clauses 70-95, wherein the tube is configured to transfer the fluid in a high or ultra-high vacuum system.
97. The method of any one of clauses 70-96, wherein forming the first tubular layer comprises forming a plurality of first tubular layers.
98. The method of any one of clauses 70-97, wherein forming the second tubular layer comprises forming a plurality of second tubular layers.
99. The method of any one of clauses 70-98, wherein forming the third tubular layer comprises forming a plurality of third tubular layers.
100. The method of any one of clauses 70-99, wherein the fluid comprises at least one of water or glycol.
101. The method of any one of clauses 70-100, wherein the gas comprises at least one of oxygen or nitrogen.
102. The system of any one of clauses 1-37, wherein the tube is a first tube.
103. The system of clause 102, further comprising a degasser system comprising:
    a housing comprising a plurality of second tubes, wherein the housing is configured to receive the fluid, and
    a vacuum system configured to remove gases from the fluid before the fluid enters the first tube.
104. The system of clause 103, wherein the vacuum system comprises a vacuum pump.
105. The system of clause 104, wherein the vacuum pump is air-driven.
106. The system of any one of clauses 102-105, wherein the removed gases flow from inside of the plurality of second tubes to the vacuum system.
107. The system of any one of clauses 102-106, wherein the fluid flows outside of the plurality of second tubes.
108. The system of any one of clauses 102-107, wherein the plurality of second tubes comprise a hollow fiber membrane.
109. The system of clause 108, wherein the hollow fiber membrane comprises polypropylene.
110. The system of any one of clauses 102-109, wherein the first tube comprises a first tubular layer of first material, wherein the first material is a flexible polymer.

111. A system, comprising:
a stage configured to secure a wafer;
a chamber configured to house the stage and wherein the chamber is configured to operate in a vacuum environment;
a first tube provided within the chamber and configured to transfer fluid between the stage and outside of the chamber; and
a degasser system comprising:
a housing comprising a plurality of second tubes, wherein the housing is configured to receive the fluid, and
a vacuum system configured to remove gases from the fluid before the fluid enters the first tube.

112. The system of clause 111, wherein the vacuum system comprises a vacuum pump.

113. The system of clause 112, wherein the vacuum pump is air-driven.

114. The system of any one of clauses 111-113, wherein the removed gases flow from inside of the plurality of second tubes to the vacuum system.

115. The system of any one of clauses 111-114, wherein the fluid flows outside of the plurality of second tubes.

116. The system of any one of clauses 111-115, wherein the plurality of second tubes comprise a hollow fiber membrane.

117. The system of clause 116, wherein the hollow fiber membrane comprises polypropylene.

118. The system of any one of clauses 111-117, wherein the first tube comprises a first tubular layer of first material, wherein the first material is a flexible polymer.

119. The system of clause 118, wherein the first tube further comprises a second tubular layer of second material, wherein the second material is configured to reduce permeation of fluid or gas through the first tube.

120. The system of any one of clauses 1-37 or 102-110, wherein the system comprises an extreme ultraviolet inspection system.

121. The system of any one of clauses 1-37 or 102-110, wherein the system comprises a deep ultraviolet inspection system.

122. The system of any one of clauses 1-37 or 102-110, wherein the system comprises an x-ray.

It will be appreciated that the embodiments of the present disclosure are not limited to the exact construction that has been described above and illustrated in the accompanying drawings, and that various modifications and changes may be made without departing from the scope thereof.

The invention claimed is:

1. A system, comprising:
a stage configured to secure a wafer;
a chamber configured to house the stage and wherein the chamber is configured to operate in a vacuum environment;
a first tube provided within the chamber and configured to transfer fluid between the stage and outside of the chamber; and
a degasser system comprising:
a housing comprising a plurality of second tubes, wherein the housing is configured to receive the fluid, and
a vacuum system configured to remove gases from the fluid before the fluid enters the first tube.

2. The system of claim 1, wherein the vacuum system comprises a vacuum pump.

3. The system of claim 2, wherein the vacuum pump is air-driven.

4. The system of claim 1, wherein the removed gases flow from inside of the plurality of second tubes to the vacuum system.

5. The system of claim 1, wherein the fluid flows outside of the plurality of second tubes.

6. The system of claim 1, wherein the plurality of second tubes comprise a hollow fiber membrane.

7. The system of claim 6, wherein the hollow fiber membrane comprises polypropylene.

8. The system of claim 1, wherein the first tube comprises a first tubular layer of first material, wherein the first material is a flexible polymer.

9. The system of claim 8, wherein the first tube further comprises a second tubular layer of second material, wherein the second material is configured to reduce permeation of fluid or gas through the first tube.

10. The system of claim 1, wherein the system comprises an extreme ultraviolet inspection system.

11. The system of claim 1, wherein the system comprises a deep ultraviolet inspection system.

12. The system of claim 1, wherein the system comprises an x-ray.

13. The system of claim 9, wherein the second tubular layer coats the first tubular layer.

14. The system of claim 9, wherein the first tube further comprises a third tubular layer of third material, wherein the third material is configured to reduce permeation of gas through the first tube.

15. The system of claim 14, further comprising an adhesion layer between each of the first tubular layer, the second tubular layer, or the third tubular layer.

\* \* \* \* \*